United States Patent
Okazaki et al.

(10) Patent No.: US 7,456,688 B2
(45) Date of Patent: Nov. 25, 2008

(54) SIGNAL EXTRACTION CIRCUIT AND DISTORTION-COMPENSATED AMPLIFIER INCORPORATING THE SAME

(75) Inventors: Yousuke Okazaki, Kawasaki (JP); Hiroaki Maeda, Kawasaki (JP); Yasushi Seino, Kawasaki (JP); Takashi Ono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/806,197

(22) Filed: May 30, 2007

(65) Prior Publication Data
US 2007/0241816 A1 Oct. 18, 2007

Related U.S. Application Data

(63) Continuation of application No. PCT/JP2004/017799, filed on Nov. 30, 2004.

(51) Int. Cl.
*H03F 1/26* (2006.01)
(52) U.S. Cl. .................. 330/149; 330/107; 330/151; 375/296
(58) Field of Classification Search ................ 330/149, 330/107, 151; 375/296
See application file for complete search history.

(56) References Cited

U.S. PATENT DOCUMENTS

| 4,313,223 | A | * | 1/1982 | Sakamoto et al. ........... 455/323 |
| 5,222,246 | A | * | 6/1993 | Wolkstein ................... 455/13.4 |
| 6,066,984 | A | * | 5/2000 | Tomaru et al. ............... 330/149 |
| 6,489,844 | B2 | * | 12/2002 | Yamashita et al. ............ 330/52 |
| 6,567,478 | B2 | * | 5/2003 | Oishi et al. .................. 375/297 |
| 6,949,976 | B2 | * | 9/2005 | Funyu et al. ................. 330/149 |

FOREIGN PATENT DOCUMENTS

| JP | 57-113603 A | 7/1982 |
| JP | 05-14291 A | 1/1993 |
| JP | 06-268536 A | 9/1994 |
| JP | 2004-248109 A | 9/2004 |
| JP | 2004-304385 | 10/2004 |
| JP | 2004-336291 A | 11/2004 |

OTHER PUBLICATIONS

Supplementary European Search Report Communication dated Jun. 4, 2008 Application No. 04822513.0 - 1233; PCT/JP2004017799.

* cited by examiner

*Primary Examiner*—Patricia Nguyen
(74) *Attorney, Agent, or Firm*—Hanify & King, P.C.

(57) ABSTRACT

To cancel a reflected wave reflected from a connecting portion (22) and leaking into a feedback signal when a non-matched component is connected, the reflected wave is extracted by a circulator (30) and its phase and amplitude are adjusted by a vector adjusting circuit (32), and then the thus adjusted reflected wave is vector-summed with the feedback signal in a vector sum circuit (34).

13 Claims, 20 Drawing Sheets

SIGNAL EXTRACTION CIRCUIT AND DISTORTION-COMPENSATED AMPLIFIER INCORPORATING THE SAME

CROSS-REFERENCE TO RELATED APPLICATIONS

This is a continuation of International Application PCT/JP2004/017799, published in Japanese, with an international filing date of Nov. 30, 2004.

TECHNICAL FIELD

The present invention relates to a signal extraction circuit for extracting a portion of a signal, and a distortion-compensated amplifier incorporating such a signal extraction circuit; more particularly, the invention relates to a signal extraction circuit suitable for use in a distortion-compensated amplifier in which a digital predistortion technique is employed, and also relates to a distortion-compensated amplifier incorporating such a signal extraction circuit.

BACKGROUND ART

In recent years, high-efficiency transmissions based on digital techniques have come to be used widely in wireless communications. When using a multilevel phase modulation scheme in wireless communications, it is important to employ a technique for linearizing transmitter amplifier characteristics, in particular, power amplifier characteristics, to suppress nonlinear distortion and thereby reduce adjacent channel leakage power, and when increasing power efficiency by using an amplifier having poor linearity, it is essential to employ a technique for compensating for the distortion occurring due to the nonlinearity of the amplifier.

For example, in mobile communications such as W-CDMA, the transmission power of a transmitter is as large as ten to several tens of watts, and the input/output characteristic of the transmitter power amplifier is nonlinear as shown by a dashed line in FIG. 1. Nonlinear distortion occurs due to this nonlinear characteristic, resulting in the transmission characteristic such that the sidelobes of the frequency spectrum centered about the transmission frequency f0 are raised as shown by a solid line SA in FIG. 2, compared with the ideal characteristic shown by a dashed line SI; this causes the signal to leak into the adjacent channels, a phenomenon called adjacent channel interference. That is, as shown in FIG. 2, the power of the transmit wave leaking into the adjacent channels increases due to nonlinear distortion. ACPR (Adjacent Channel Power Ratio), a measure of the magnitude of the leakage power, is the ratio of the leakage power, represented by the area of the spectrum leaking into the adjacent channel bounded by a semi-dashed line A or A' and a dash-double-dot-line B or B' in FIG. 2, to the power in the main channel represented by the area of the spectrum bounded by semi-dashed lines A and A'. Such leakage power causes noise to other channels, degrading the communication quality of the affected channels. Therefore, its level is strictly limited by regulations.

The above description explains the case where the transmit wave is a single wave; on the other hand, when transmitting the signal on a plurality of waves, for example, four waves, sidelobes (distortion components) SL occur, as shown in FIG. 3, in the frequency spectrum centered about the center frequency f1 of the transmit signal, causing the signal to leak into the adjacent channels and interfere with the adjacent channels.

To address this, ideally the characteristic must be corrected to exhibit a frequency spectrum identical to that shown by dashed line SI in FIG. 2 in the case of a single wave, or to exhibit the frequency spectrum free from sidelobes as shown in FIG. 4 in the case of four waves.

Leakage power is small, for example, in the linear region of the power amplifier (see FIG. 1), and increases in the nonlinear region. Therefore, to provide a high-output transmitter power amplifier, the linear region must be enlarged. This, however, would require the use of an amplifier having a higher capability than necessary, rendering this solution disadvantageous in terms of cost and apparatus size. In view of this, a distortion-compensated amplifier is employed that is equipped with a distortion compensating function to compensate for the distortion caused by the nonlinearity of the power amplifier.

There are various distortion compensating techniques, one example of which is the predistortion technique described, for example, in Japanese Unexamined Patent Publication No. 2001-267850.

Predistortion is a technique in which a distortion having an inverse relationship to the distortion expected to occur in the amplifier is introduced into the signal to be input to the amplifier, thereby reducing the distortion of the amplified signal.

Here, since the distortion that occurs in the amplifier varies depending on the input signal (in particular, the level of the input signal), a coefficient (distortion compensating coefficient) for providing the inverse distortion characteristic is computed as a function of the input signal, and the input signal is corrected based on this coefficient. Further, to address change over time of the characteristics of the amplifier, etc., a portion of the output of the amplifier is fed back, and the distortion compensating coefficient is updated by recalculating it based on the feedback signal, as well as the input signal to the amplifier.

Accordingly, the distortion compensating coefficient cannot be correctly calculated unless the feedback signal is one in which the output of the amplifier is correctly reflected.

FIG. 5 shows the circuit from the final-stage amplifier 10 to an antenna 13, wherein reference numeral 12 is a directional coupler as a distributor for extracting a portion of the output of the amplifier 10 as the feedback signal, 14 is an isolator, and 16 is a cable. When a matched component is connected as antenna 13, the signal (feedback signal) 20 extracted by the directional coupler 12 has the same waveform as the output signal of the amplifier 10. However, when a non-matched component is connected, the signal reflected at the input portion 22 of the connected component will leak into the feedback signal, resulting in an inability to accurately obtain the output waveform of the amplifier. (In usual base station operation conditions, for example, when the VSWR of the antenna is about 20, the chance that a well-matched component will be connected is low.) The most dominant among the reflected signal components leaking into the feedback signal is one indicated by arrow 24, i.e., the signal that is passed through directional coupler 12, is reflected at the output end of the transistor acting as amplifier 10, and is separated by the directional coupler 12. On the other hand, the reflected wave traveling along the route indicated by arrow 26 is sufficiently attenuated before leaking into the feedback path, because the amount of coupling in the directional coupler is small for this reflected wave.

If an unwanted wave leaks into the feedback signal, the feedback signal waveform which would otherwise be flat will be distorted as shown in FIG. 6, and as a result, a signal that cancels the leaking reflected wave will be generated as shown in FIG. 7.

This causes problems such as a fluctuation in the output power level of the transistor output signal and the occurrence of distortion in the output waveform.

Possible solutions to these problems would be to insert an isolator and thereby attenuate the reflected wave leaking into the coupler, or to configure the transistor final stage as a balanced amplifier thereby reducing the reflection at the transistor output end, but either solution creates a problem that the amount of circuitry increases.

Patent document 1: Japanese Unexamined Patent Publication No. 2001-267850

Patent document 2: Japanese Unexamined Patent Publication No. H06-268536

Patent document 3: Japanese Unexamined Patent Publication No. S57-113603

DISCLOSURE OF THE INVENTION

Problems to be Solved by the Invention

It is accordingly an object of the present invention to provide a signal extraction circuit that achieves a distortion-compensated amplifier having an excellent distortion compensating characteristic.

According to the present invention, there is provided a signal extraction circuit comprising: a distributor which is provided between a connecting portion to an antenna and an output of an amplifier, and which extracts a portion of the output of the amplifier as a feedback signal; an irreversible element, provided between the connecting portion and the output of the amplifier, for extracting a reflected signal produced at the connecting portion; a combining circuit which combines the feedback signal with the reflected signal; and a vector adjusting circuit which is provided at least one of a point between the distributor and the combining circuit and a point between the irreversible element and the combining circuit, and which is capable of adjusting at least one of the phase and amplitude of the signal input thereto.

Preferably, the vector adjusting circuit is provided between the irreversible device and the combining circuit.

According to the present invention, there is also provided a distortion-compensated amplifier comprising: an amplifier for amplifying a signal; a distributor which is provided between a connecting portion to an antenna and an output of the amplifier, and which extracts a portion of the output of the amplifier as a feedback signal; a predistorter which, based on an input to the amplifier and on the feedback signal, corrects the input to be applied to the amplifier and thereby cancels distortion occurring in the amplifier; an irreversible element, provided between the connecting portion and the output of the amplifier, for extracting a reflected signal produced at the connecting portion; a combining circuit which combines the feedback signal with the reflected signal and thereby generates the feedback signal to be supplied to the predistorter; and a vector adjusting circuit which is provided at at least one of a point between the distributor and the combining circuit and a point between the irreversible element and the combining circuit, and which is capable of adjusting at least one of the phase and amplitude of the signal input thereto.

It is desirable that the distortion-compensated amplifier further comprises: a quality evaluator which evaluates the quality of the output of the combining circuit; and an automatic adjuster which automatically adjusts at least one of the phase and the amplitude in the vector adjusting circuit, based on a quality evaluation result supplied from the quality evaluator.

BEST MODE FOR CARRYING OUT THE INVENTION

Figure 1:
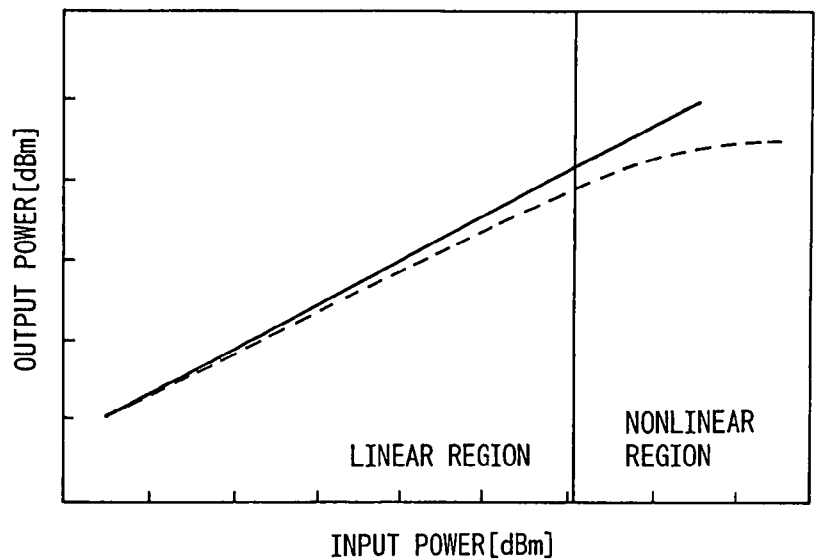
FIG. 1 is a graph showing one example of the input/output characteristic of a transmitter power amplifier.
Figure 2:
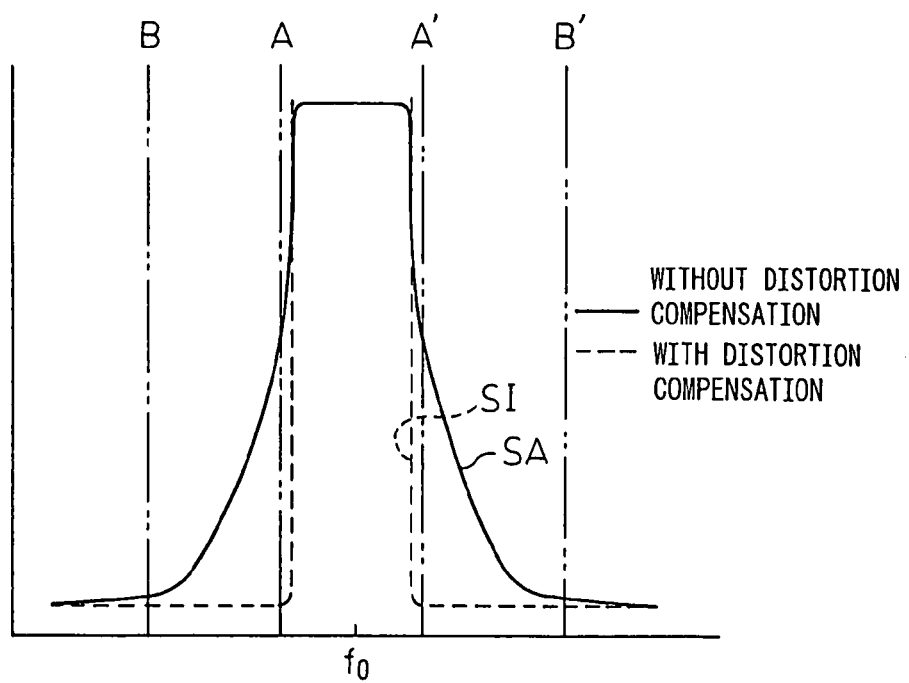
FIG. 2 is a diagram showing the frequency spectrum of a transmit signal.
Figure 3:
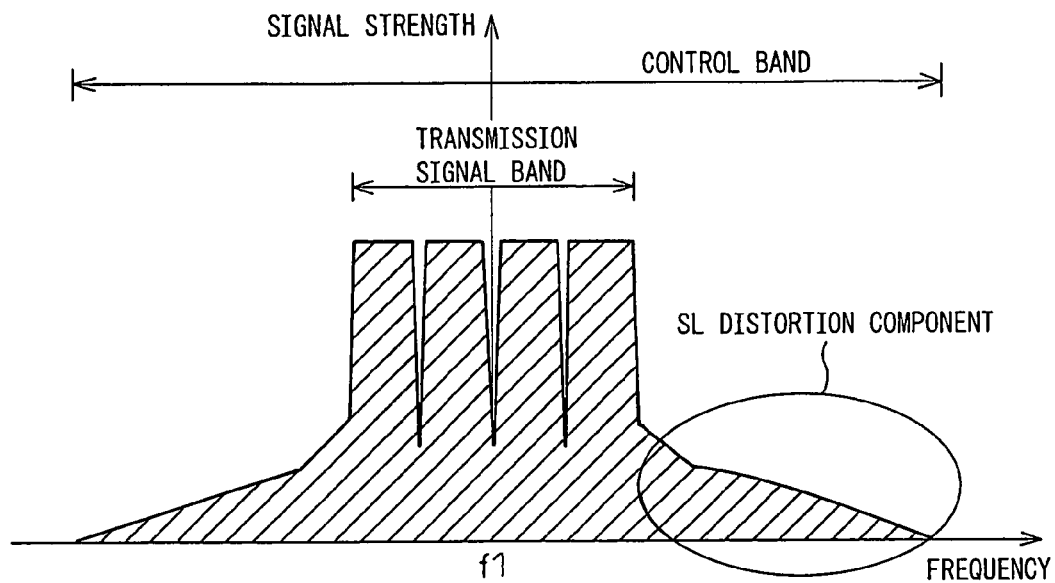
FIG. 3 is a diagram showing the frequency spectrum for a plurality of waves when sidelobes exist.
Figure 4:
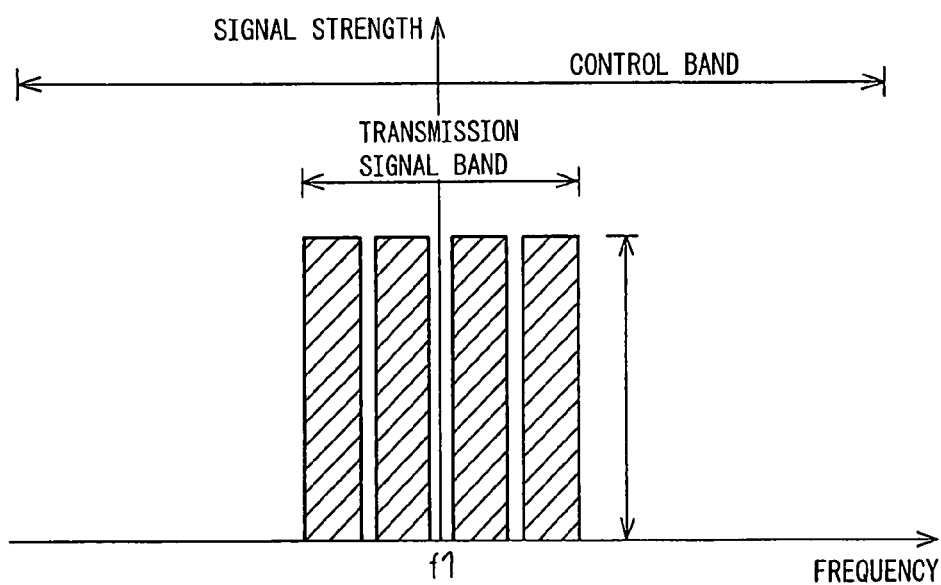
FIG. 4 is a diagram showing the frequency spectrum for the plurality of waves when there are no sidelobes.
Figure 5:
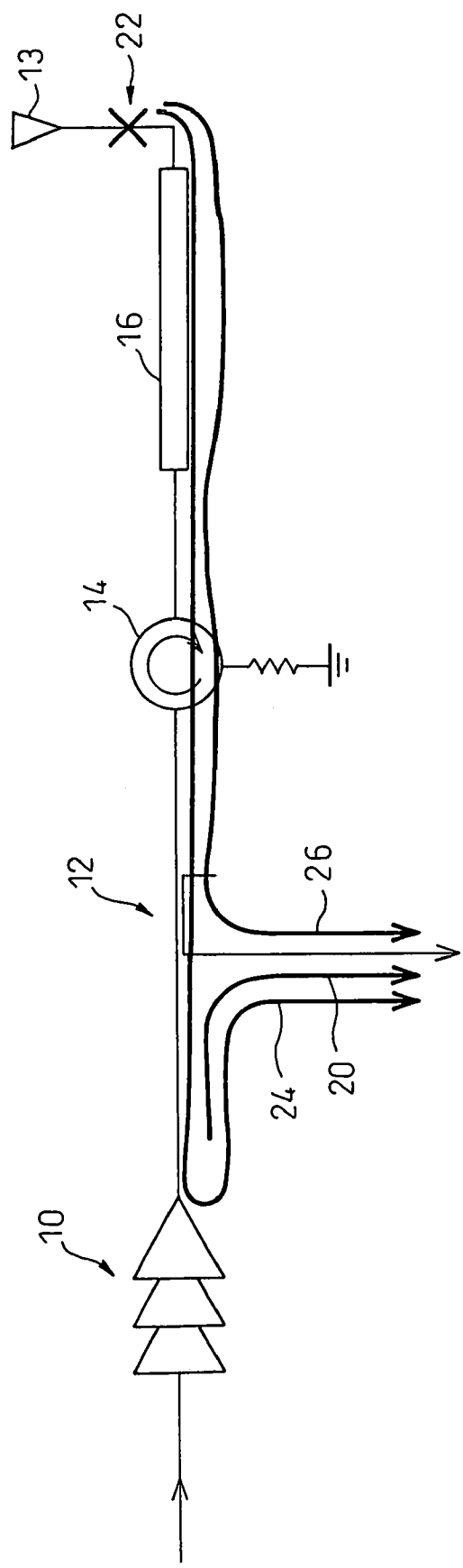
FIG. 5 is a diagram explaining the leakage of a reflected wave in a prior art signal extraction circuit.
Figure 6:
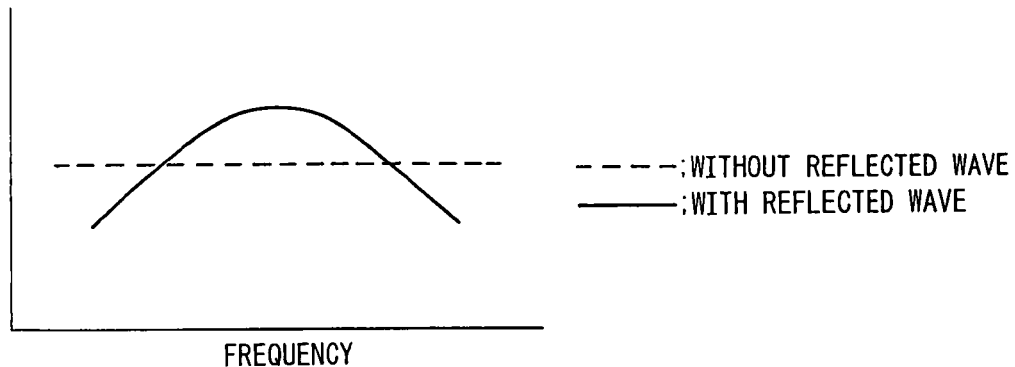
FIG. 6 is a diagram explaining the distortion of a feedback signal waveform due to the leakage of the reflected wave.
Figure 7:
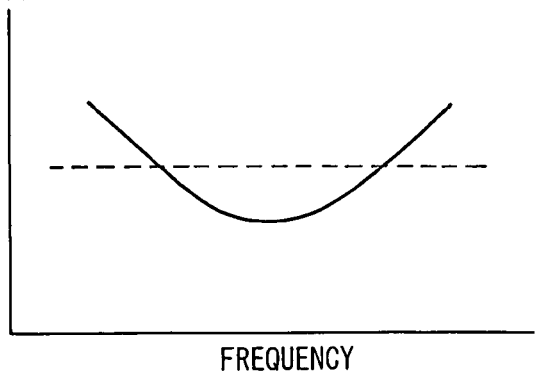
FIG. 7 is a diagram explaining the distortion of a distortion compensating signal due to the leakage of the reflected wave.
Figure 8:
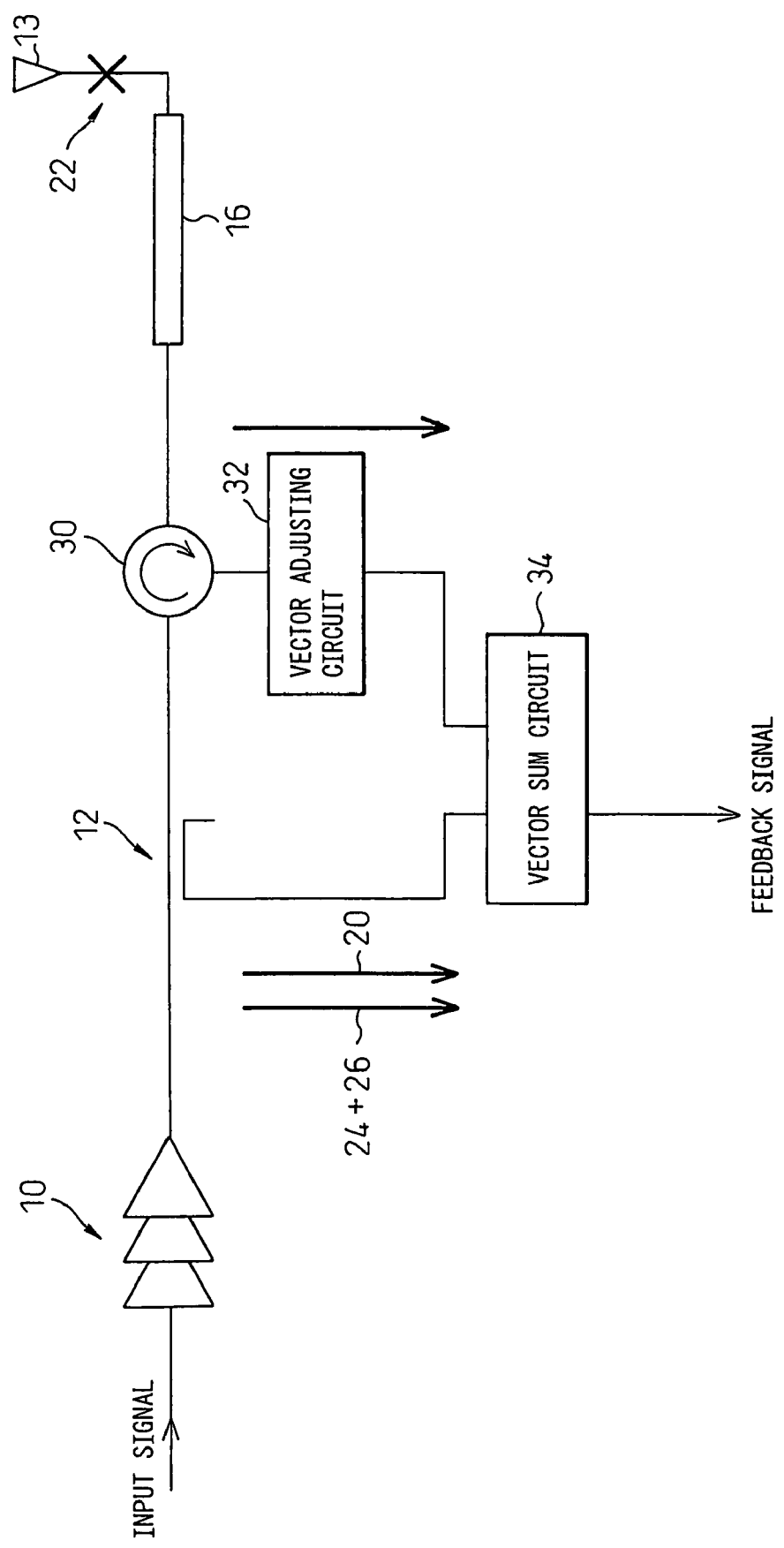
FIG. 8 is a circuit diagram showing a signal extraction circuit according to one embodiment of the present invention.

FIG. 8 shows the configuration of one example of a signal extraction circuit according to one embodiment of the present invention. The same component elements as those in FIG. 5 are designated by the same reference numerals. Isolator 14 in FIG. 7 is replaced by circulator 30 for extracting a reflected signal.

Among the signal components reflected from the connecting portion 22 of the antenna 13 and leaking into the feedback signal (20), the dominant one is, as earlier described, the component that is passed through the directional coupler 12, reflected at the output end of the transistor 10, and is separated by the directional coupler 12, and the next dominant one is the component that directly leaks into the feedback signal in the directional coupler 12; there could also be other components leaking into the feedback signal (20) through many different paths. However, the sum of these components can be expressed by a single vector having a certain amplitude and phase.

In view of this, if the reflected signal produced at the connecting portion 22 is extracted by the circulator 30, and the extracted signal is summed with the feedback signal in a vector sum circuit 34 after adjusting the amplitude and phase of the extracted signal by a vector adjusting circuit 32 so that the signal is equal in amplitude, but opposite in phase to the reflected signal leaking into the feedback signal 20, then the reflected signal (24+26) leaking into the feedback signal (20) can be canceled.

The vector adjusting circuit 32 can be implemented by combining an attenuator or amplifier with a phase shifter. The vector sum circuit 34 is implemented, for example, by a hybrid.

Figure 9:
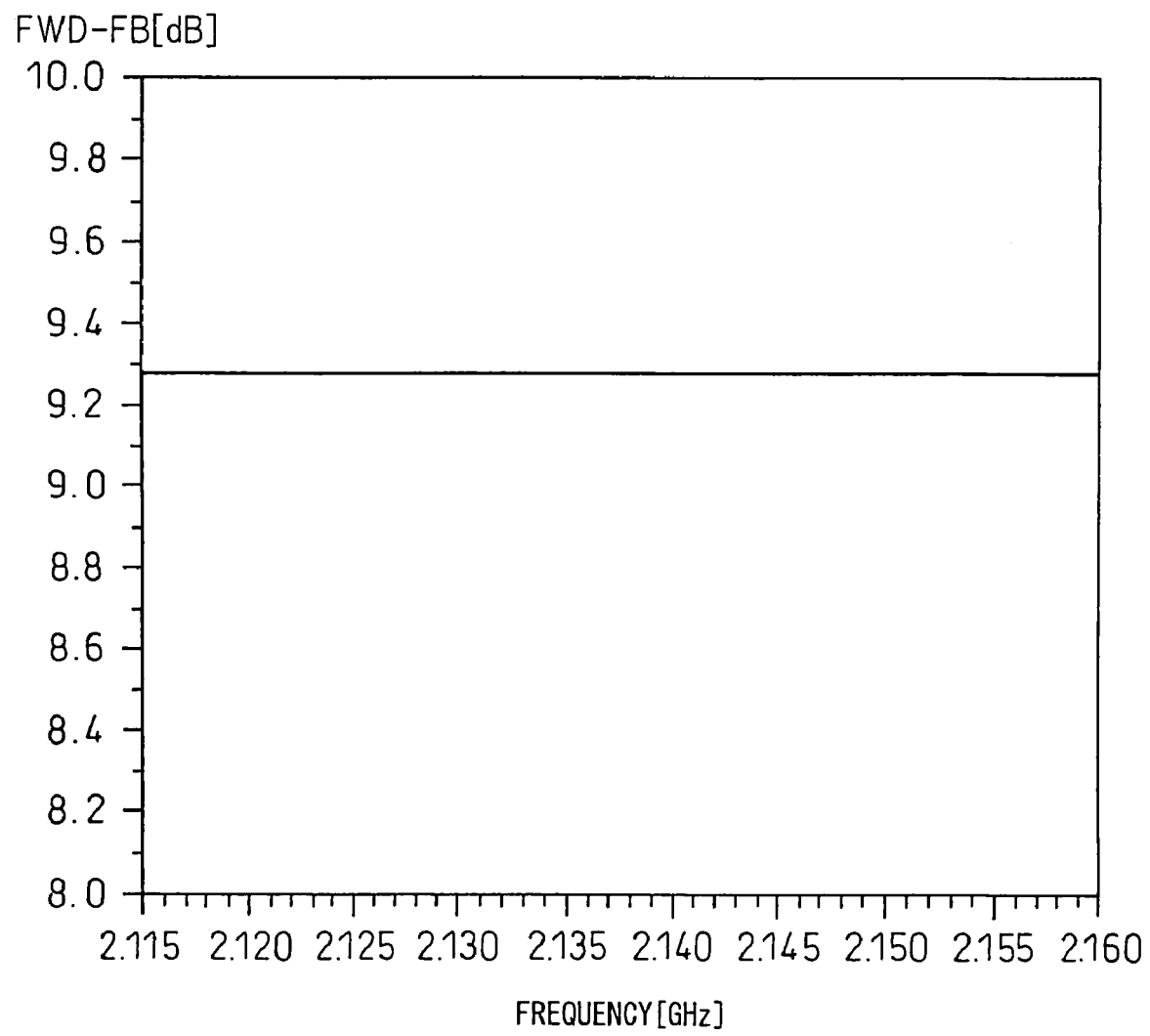
FIG. 9 is a graph showing a simulation result indicating the difference between the signal traveling toward an antenna and the feedback signal when a matched component is connected.
Figure 10:
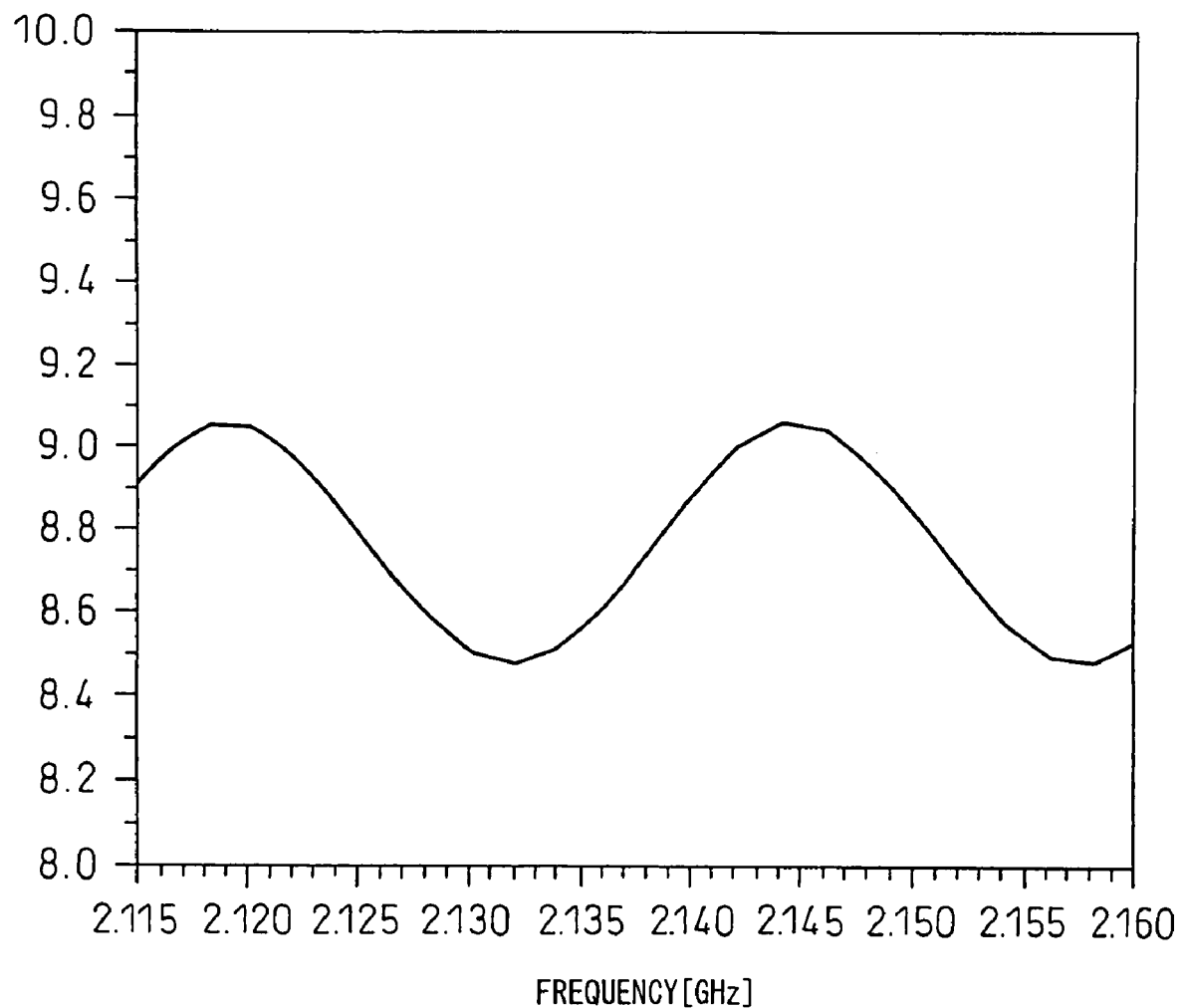
FIG. 10 is a graph showing a simulation result indicating the difference between the signal traveling toward the antenna and the feedback signal when a non-matched component is connected in the prior art circuit.
Figure 11:
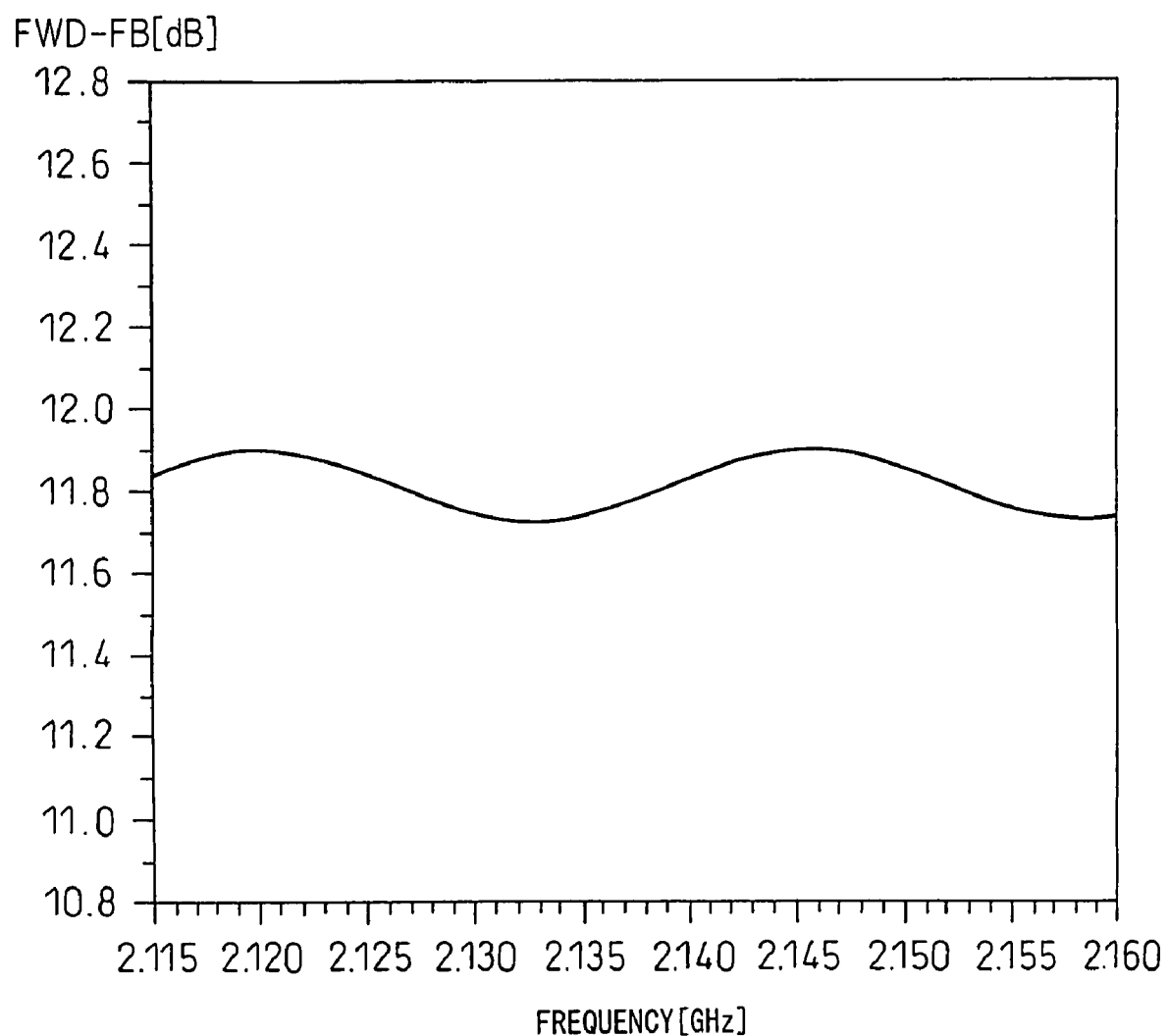
FIG. 11 is a graph showing a simulation result indicating the difference between the signal traveling toward the antenna and the feedback signal when a non-matched component is connected in the circuit according to the one embodiment of the present invention.

FIGS. 9 to 11 are diagrams showing simulation results in the form of graphs demonstrating the effects achieved by the embodiment of the present invention. In each graph, the abscissa represents the frequency, and the ordinate represents the difference between the signal (FWD signal) directed from the isolator 14 (FIG. 5) or the circulator 30 (FIG. 8) toward the antenna 11 through the cable 16 and the feedback signal (FB signal) separated by the directional coupler 12. The waveform of the FWD signal should normally be the same as that of the FB signal so that when a matched component is connected, the difference FWD−FB (dB) is constant irrespective of the frequency as shown in FIG. 9, even in the case of the prior art circuit of FIG. 5. On the other hand, when a non-matched component is connected, the waveform is disturbed, as shown in FIG. 10, due to the reflected wave in the case of the prior art circuit of FIG. 5. By contrast, in the circuit of FIG. 8 according to the embodiment of the present invention, when a non-matched component is connected, if a suitable amount of attenuation and a suitable amount of phase shift are applied to the vector adjusting circuit 32, the amplitude is reduced as shown in FIG. 11 to one half or less than that of FIG. 10.

Figure 12:
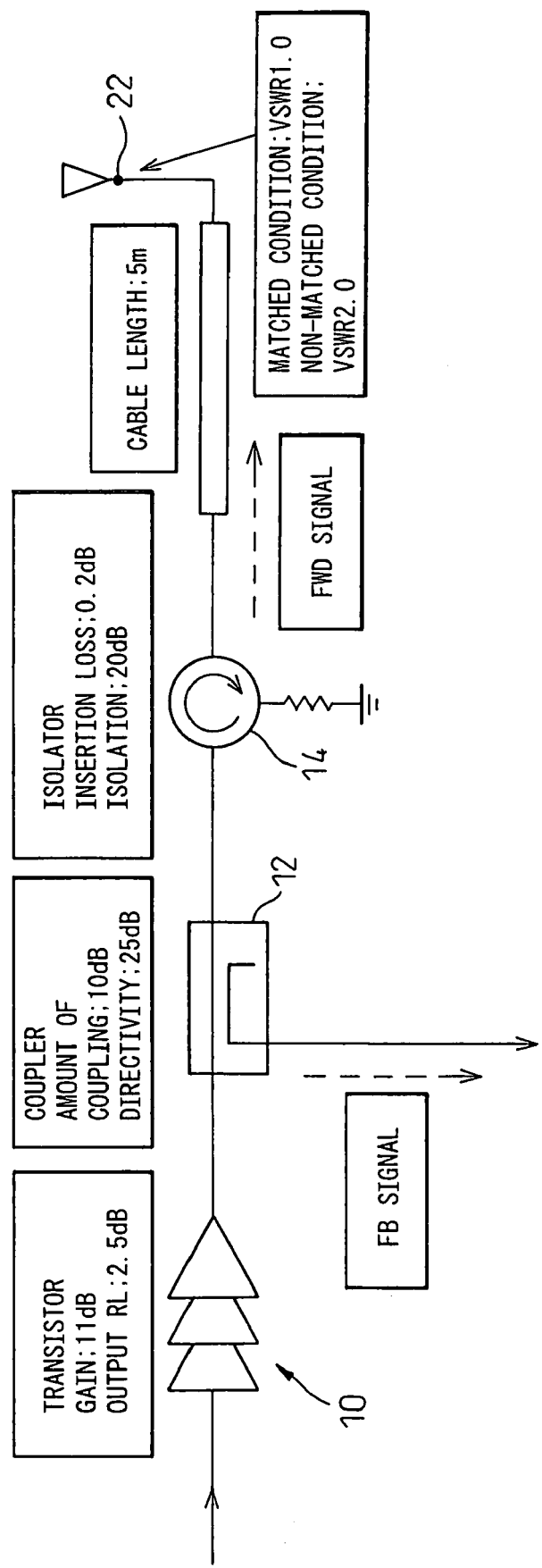
FIG. 12 is a diagram showing parameters used in simulation calculations.
Figure 13:
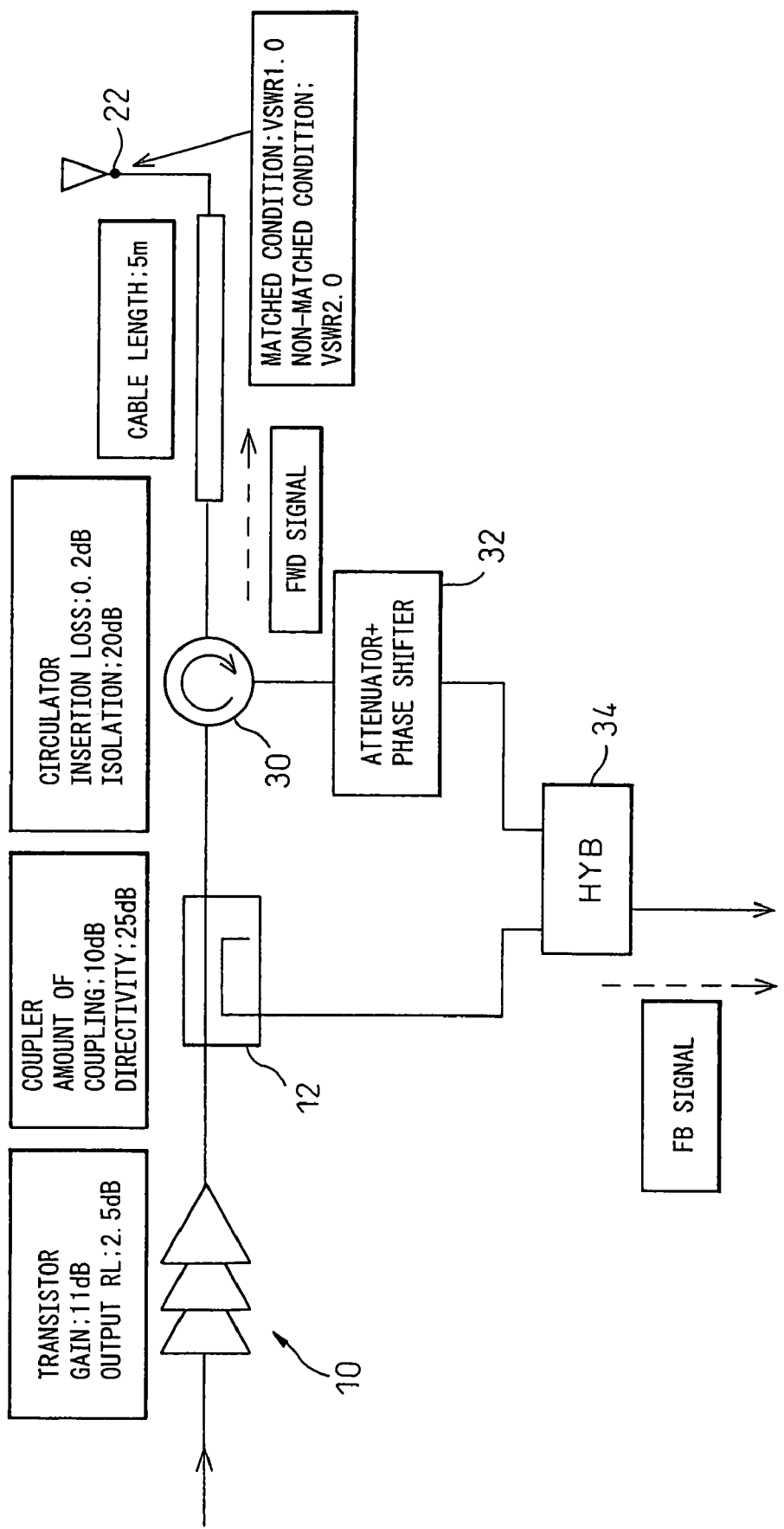
FIG. 13 is a diagram showing parameters used in simulation calculations.

The parameters used in the simulation calculations are shown in FIG. 12 (for the prior art circuit of FIG. 5) and in FIG. 13 (for the embodiment of FIG. 8). Here, the gain of transistor 10 is 11 dB, and the output RL (Return Loss) is 2.5 dB. That is, the reflected signal from the connecting portion 22 returns to the transistor side, and the signal that underwent the attenuation of 2.5 dB is obtained as the reflection at the transistor 10 at its output end. The amount of coupling in the coupler (directional coupler) 12 is 10 dB, and the directivity is 25 dB. That is, when the signal from the transistor 10 is separated as the FB signal by the coupler, the signal undergoes the attenuation of 10 dB. Conversely, the reflected signal reflected from the connecting portion 22 and entering the coupler in the opposite direction is attenuated by 10+25=35 dB. The insertion loss of the isolator 14 or circulator 30 is 0.2 dB, and the isolation is 20 dB. That is, the signal from the transistor 10 is supplied to the antenna after undergoing the attenuation of 0.2 dB in the circulator, and conversely, the reflected signal from the connecting portion 22 undergoes the attenuation of 20 dB in the circulator and is output on the side connected to the coupler 12.

As a result, the signal output as the FB signal from the coupler 12 in FIG. 12 basically contains not only the desired feedback signal that has traveled along the route 20 shown in FIG. 5 and undergone the attenuation of 10 dB in the coupler 12, but also the reflected signal from the connecting portion 22 that has undergone a total attenuation of 32.5 dB through the isolator 14, transistor 10, and coupler 12, while traveling along the route 24 shown in FIG. 5, and the reflected signal that has undergone a total attenuation of 55 dB through the isolator 14 and coupler 12 while traveling along the route 26 shown in FIG. 5.

The signal output as the FB signal from the coupler 12 in FIG. 13 is essentially the same as that shown in FIG. 12, but the signal extracted by the circulator 30 and output on the side connected to the HYB 34 contains the reflected signal from the connecting portion 22 that has been attenuated by the insertion loss of 0.2 dB in the circulator 30.

Accordingly, by adjusting the attenuator (phase shifter) 32 acting as the vector adjuster, the reflected signal contained in the feedback signal from the coupler 12 can be suppressed using the reflected signal output from the circulator 30; it is believed that for this reason, the simulation result shown in FIG. 11 has been obtained.

The amount of adjustment of the vector adjuster should be set by aiming to suppress the reflected signal that has traveled along the route 24 shown in FIG. 5 and that is largely contained in the feedback signal; that is, it is desirable that the amount of phase shift be set so as to match the known distance difference between the path starting from the circulator 30 and leading to the HYB 34 via the transistor 10 where the signal is reflected and via the coupler 12 and the path leading from the circulator 30 to the HYB 34, and that the amount of attenuation be set so as to match the difference in the amount of attenuation resulting from the path difference.

Figure 14:
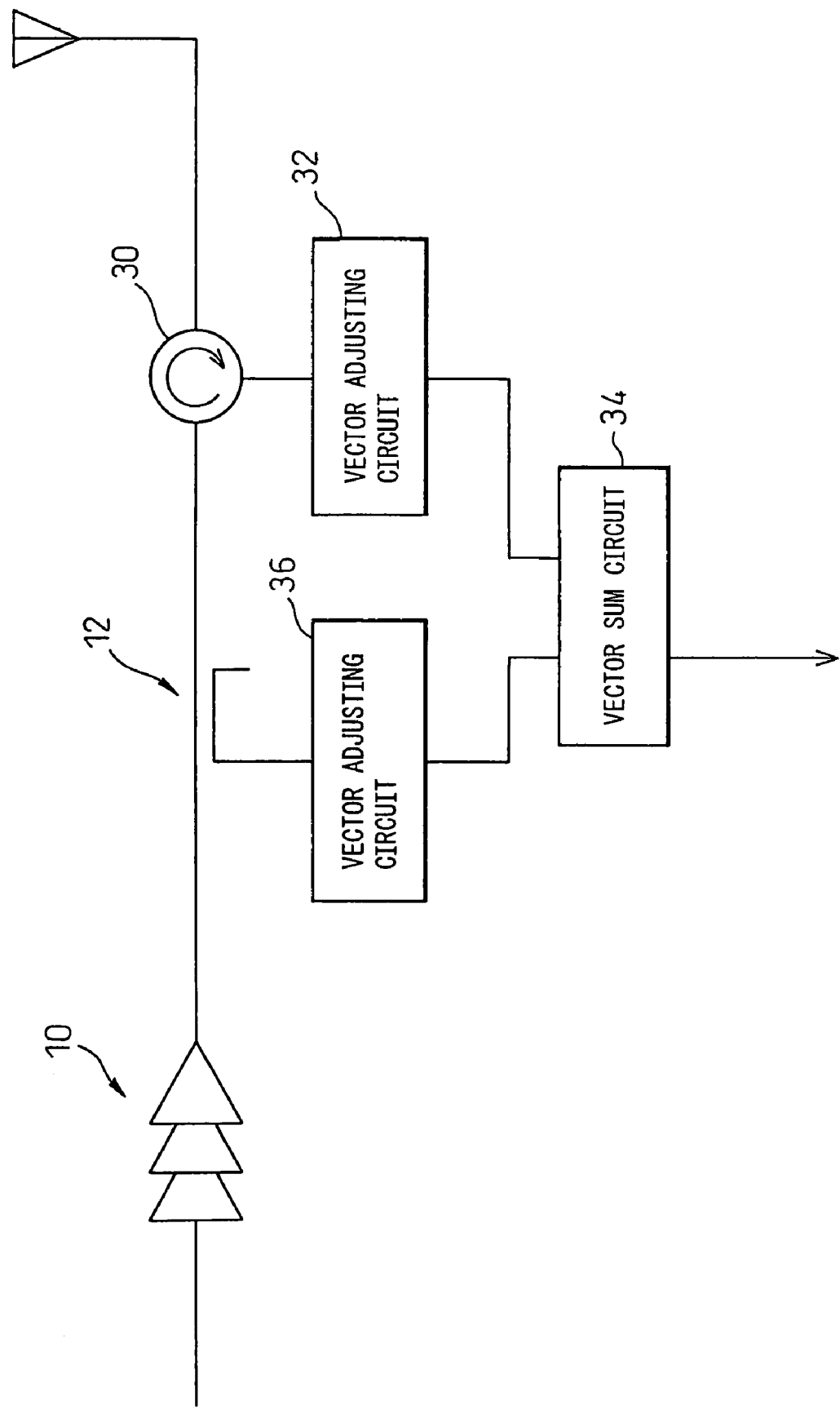
FIG. 14 is a circuit diagram showing another example of the signal extraction circuit according to the embodiment of the present invention.

As shown in FIG. 14, an additional vector adjusting circuit 36 may be interposed between the coupler 12 and the vector sum circuit 34 so that the amplitude and phase of the reflected wave to be canceled can also be adjusted. As an alternative configuration, the vector adjusting circuit 32 may be omitted, and only the reflected wave to be canceled can be adjusted. In that case, the amplitude adjustment in the vector adjusting circuit 36 is made using a variable gain amplifier, not a variable attenuator, as the level of the reflected wave leaking through the coupler 12 is generally smaller than the level of the reflected wave extracted by the circulator 30.

Figure 15:
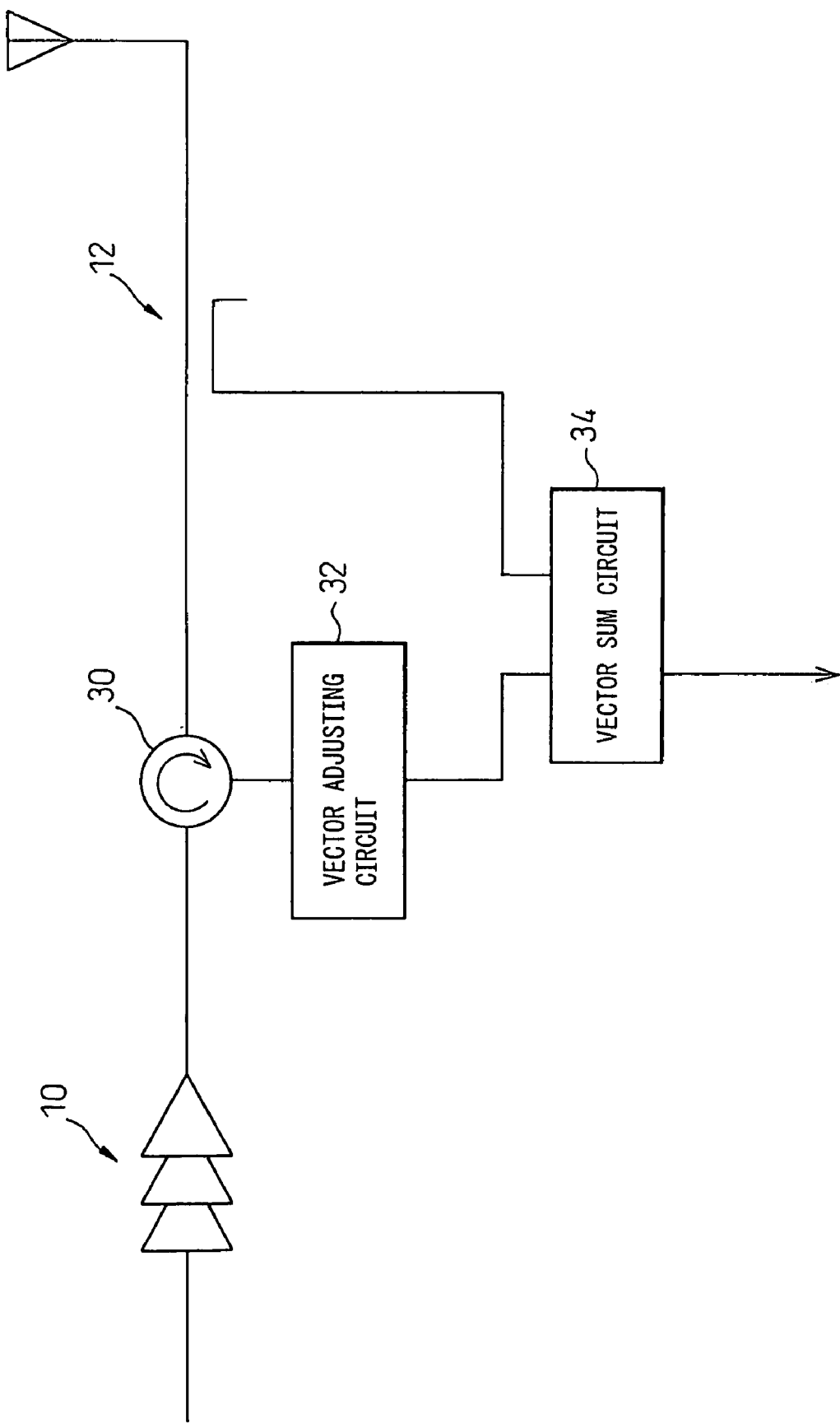
FIG. 15 is a circuit diagram showing still another example of the signal extraction circuit according to the embodiment of the present invention.

As shown in FIG. 15, the circulator 30 for extracting the reflected wave may be provided between the amplifier 10 and the coupler 12.

Figure 16:
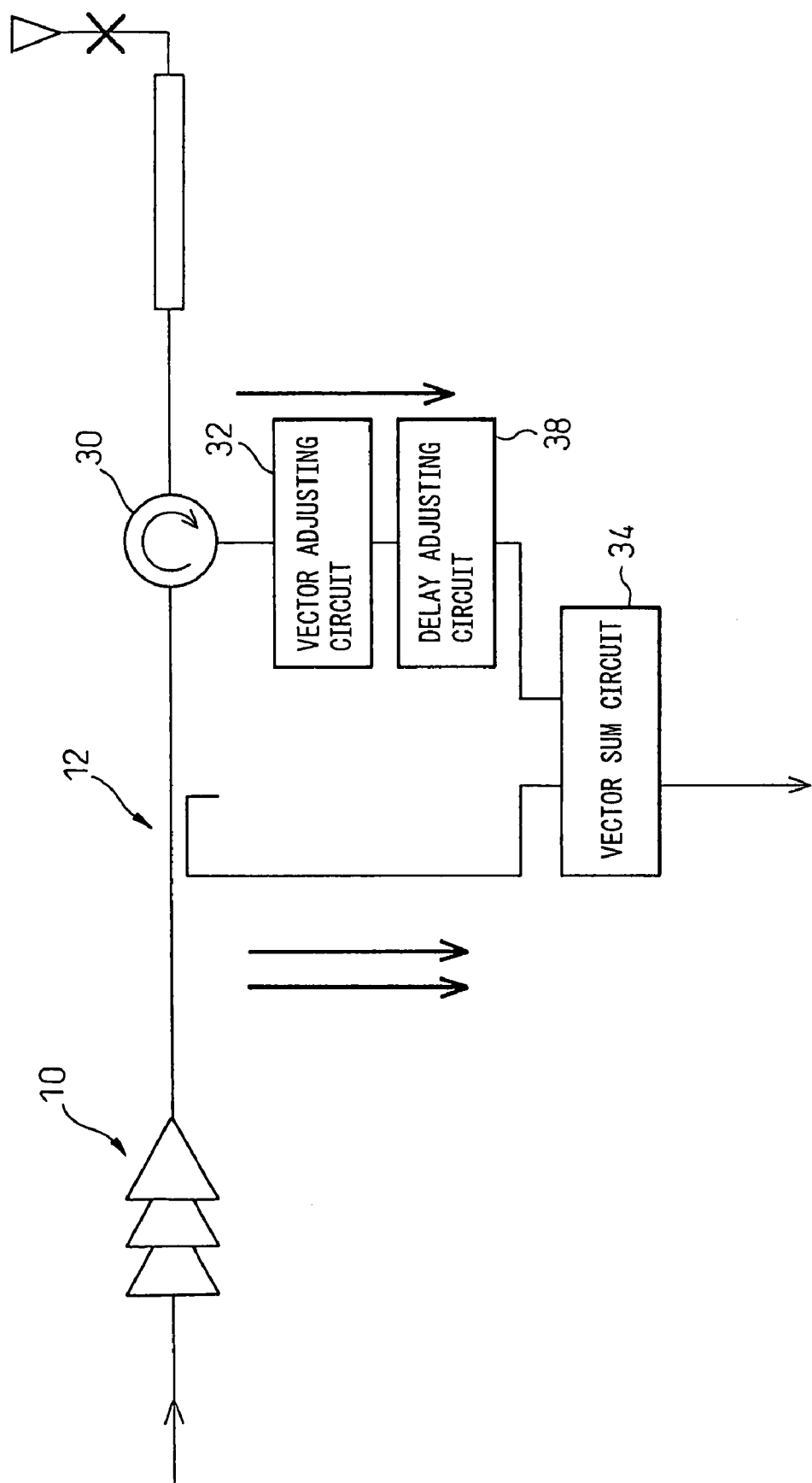
FIG. 16 is a circuit diagram showing yet another example of the signal extraction circuit according to the embodiment of the present invention.

FIG. 16 shows another example of the signal extraction circuit according to the embodiment of the present invention. In addition to the vector adjusting circuit 32 which adjusts the amplitude and phase, a delay adjusting circuit 38 is provided which adjusts the delay so that the reflected wave can be canceled over a wider bandwidth. The delay adjusting circuit may be used in combination with the vector adjusting circuit 36 in FIG. 14. The delay adjusting circuit 38 can be implemented using, for example, a delay line.

Figure 17:
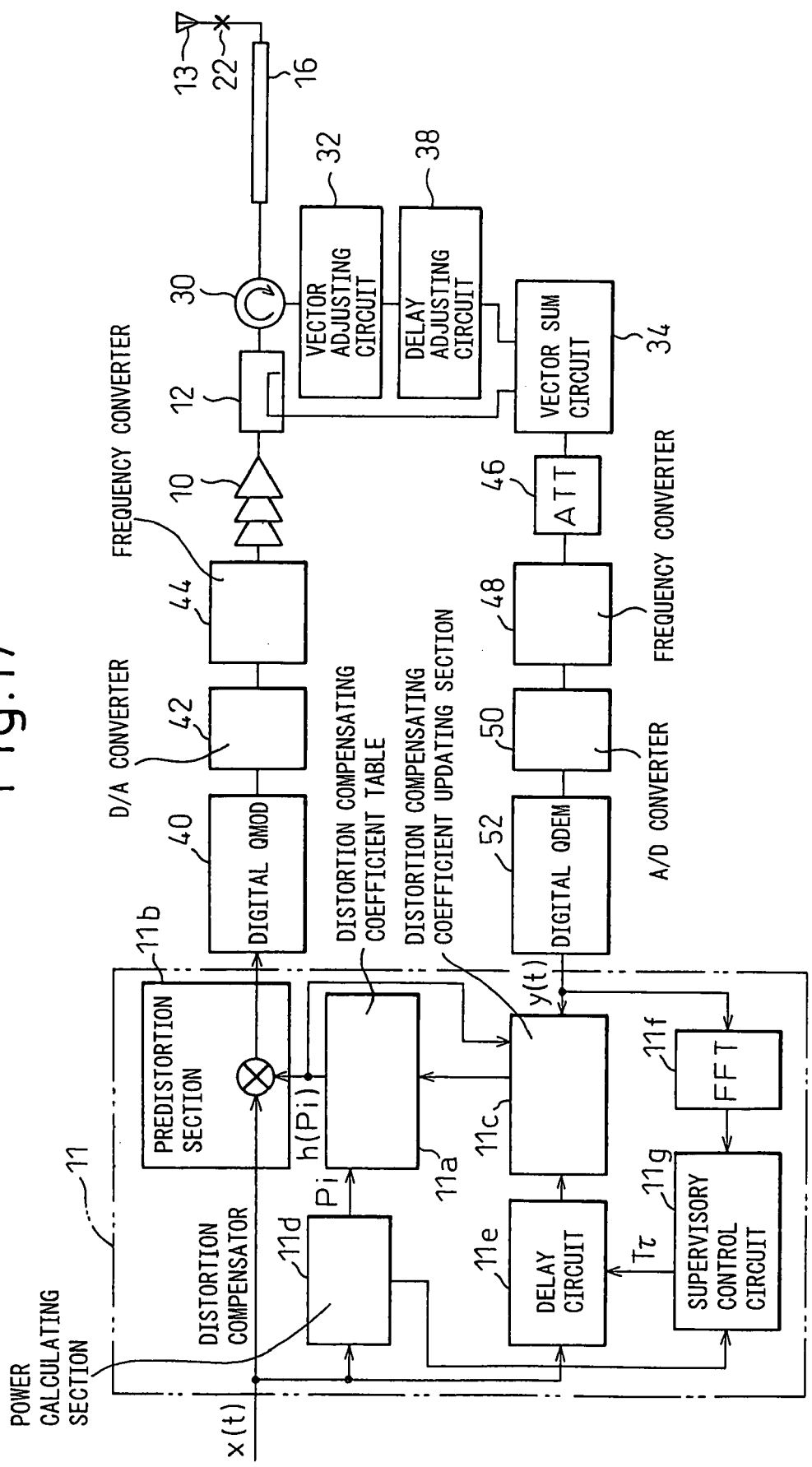
FIG. 17 is a circuit diagram showing one example of a distortion-compensated amplifier according to an embodiment of the present invention.

FIG. 17 shows the configuration of one example of a distortion-compensated amplifier according to one embodiment of the present invention incorporating the signal extraction circuit of the foregoing embodiment of the present invention. In FIG. 17, a transmit signal x(t) is input as a complex signal to a distortion compensator 11. The distortion compensator 11 comprises: a distortion compensating coefficient storage section (distortion compensating coefficient table) 11a which stores distortion compensating coefficients h(pi) for various power levels pi of the transmit signal x(t); a predistortion section 11b which applies distortion compensation (predistortion) to the transmit signal by using the distortion compensating coefficient h(pi) corresponding to the power level of the transmit signal; a distortion compensating coefficient computing section 11c which compares the transmit signal x(t) with the demodulated signal (feedback signal) y(t) output from a quadrature detector to be described later, and updates the distortion compensating coefficient h(pi) by computing it so as to reduce the difference, for example, to zero; a power calculating section lid which calculates the power of the transmit signal; a delay circuit lie in which a delay time Tτ, i.e., the time elapsed from the moment that the transmit signal x(t) is input to the distortion compensator 11 until the feedback signal y(t) is input to the distortion compensating coefficient computing section 11c, is set, and which delays the transmit signal x(t) by that delay time; an FFT section (Fast Fourier Transformer) 11f which computes the frequency distribution by fast Fourier transforming the transmit signal x(t) for a predetermined period, in order to calculate the ACPR by finding any distortion component contained in the feedback signal y(t) and lying outside the transmission signal frequency band; and a supervisory control circuit 11g which calculates the ACPR by determining the power of the transmit signal and the power of the out-of-band distortion component based on the result of the fast Fourier transform, and performs the setting and adjustment of the delay time Tτ so as to optimize the ACPR.

The power calculating section lid in the distortion compensator 11 calculates the power of the input transmit signal x(t), reads the distortion compensating coefficient table 11a to retrieve the distortion compensating coefficient h(pi) corresponding to the thus calculated power pi, and supplies it to the predistortion section 11b. The predistortion section 11b performs distortion compensation (predistortion) by multiplying the transmit signal x(t) by the distortion compensating coefficient h(pi) corresponding to the power level of the transmit signal, and outputs the result.

The complex signal to which the distortion compensation has been applied in the distortion compensator 11 is input to a digital modulator (QMOD) 40. The digital modulator 40 applies digital quadrature modulation to the in-phase component and quadrature component (I and Q signals) of the distortion compensated signal, and the quadrature-modulated digital signal is converted by a DA converter 42 into an analog signal which is input to a frequency converter 44. The frequency converter 44 mixes the quadrature-modulated signal with a local oscillator signal to upconvert the modulated signal frequency to a radio frequency for input to the transmitter amplifier 10.

The amplifier 10 amplifies the radio-frequency input signal. The amplified radio-frequency transmit signal passes through the distributor 12 and the circulator 30, and is input via the feed line 16 to the antenna 13 which radiates the transmit signal into the air. A portion of the transmit signal output from the amplifier 10 is separated by the distributor 12 constructed from a directional coupler, and is input to the vector sum circuit 34. The circulator 30 extracts the reflected wave reflected from the connecting portion 22 of the antenna 13, and supplies it to the vector adjusting circuit 32. In the vector adjusting circuit 32 and the delay adjusting circuit 38, the amplitude, phase, and delay of the reflected wave are adjusted so as to cancel the reflected wave component contained in the signal separated by the distributor 12, and the thus adjusted reflected wave is vector-summed with the separated signal in the vector sum circuit 34. The output of the vector sum circuit 34 is supplied to a frequency converter 48 after being attenuated by an attenuator 46. The frequency converter 48 downconverts the radio-frequency signal to the baseband signal which is input to an AD converter 50. The AD converter 50 converts the baseband signal into digital form for input to the digital quadrature demodulator (QDEM) 52. The digital quadrature demodulator 52 applies quadrature demodulation to the input signal to recover the baseband signal at the transmitting end, and supplies it as the feedback signal y(t) into the distortion compensating coefficient updating section 11c. The distortion compensating coefficient computing section 11c compares the transmit signal x(t) delayed through the delay circuit 11e with the demodulated signal (feedback signal) y(t) supplied from the digital quadrature demodulator 52, computes the distortion compensating coefficient h(pi) in accordance with an adaptive control algorithm so as to reduce the difference to zero, and updates the current coefficient in the distortion compensating coefficient table 11a with the thus computed distortion compensating coefficient. In the meantime, the supervisory control circuit 11g calculates the ACPR by determining the transmit signal power and the out-of-band leakage power (distortion component power) based on the fast Fourier transform result supplied from the FFT section 11f, and adjusts the delay time Tτ so as to optimize the ACPR.

By repeating the above sequence of operations, the nonlinear distortion of the radio-frequency amplifier 10 is suppressed, and the adjacent leakage power reduces.

Figure 18:
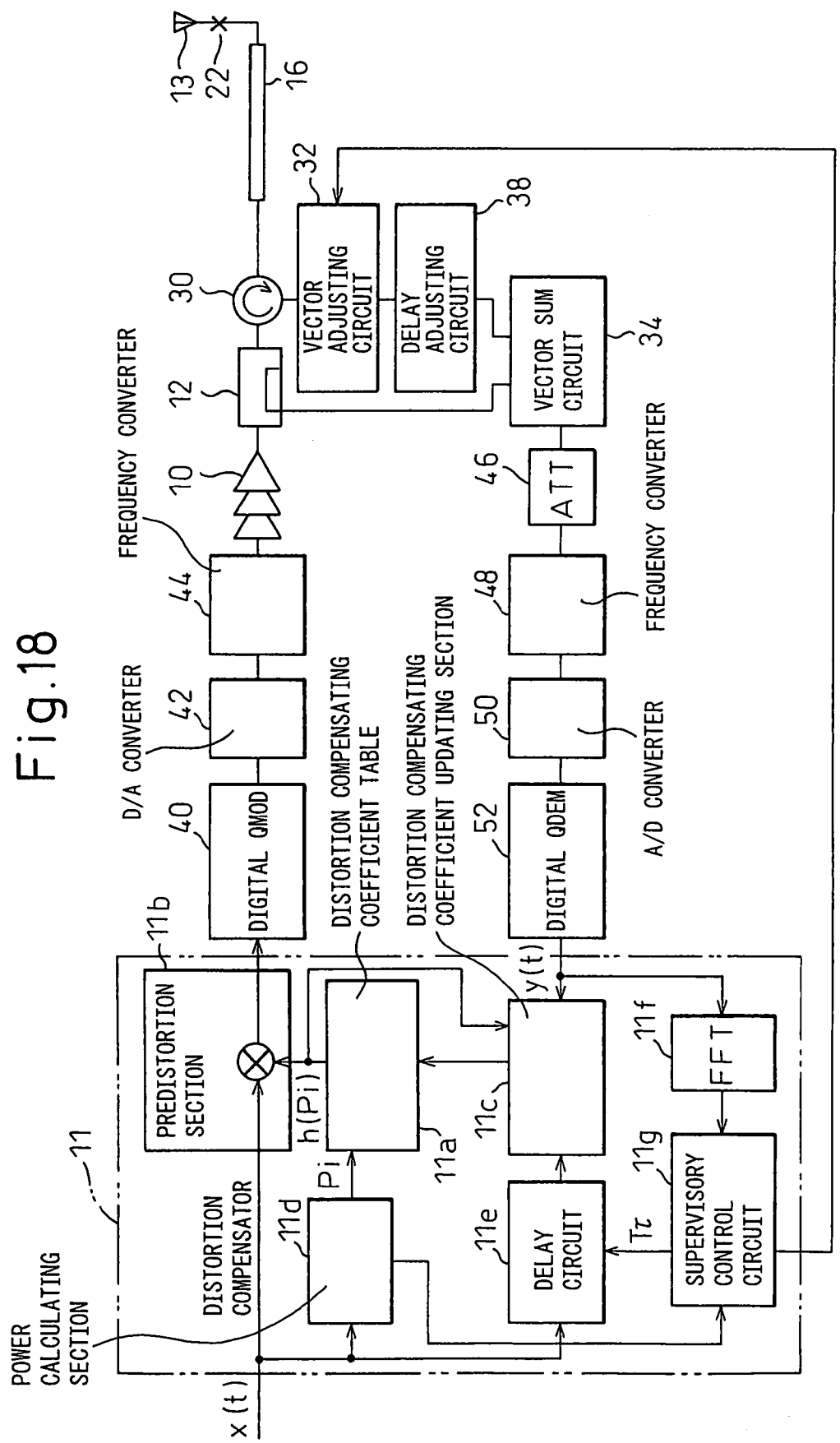
FIG. 18 is a circuit diagram showing another example of the distortion-compensated amplifier according to the embodiment of the present invention.

FIG. 18 shows an example in which an automatic adjusting function for automatically adjusting the vector adjusting circuit 32 is added in the distortion-compensated amplifier of FIG. 17. By suitably setting the amounts of phase and amplitude adjustments for the vector adjusting circuit 32 before starting the operation, the leakage of the reflected wave into the feedback signal can be sufficiently reduced, but by automatically adjusting them also during the operation, further optimization can be achieved.

As earlier described, the supervisory control circuit 11g calculates the ACPR from the result of the Fourier transform of the feedback signal y(t), and determines the delay time Tτ so as to optimize the ACPR. More specifically, the delay time Tτ is, for example, increased or decreased, and the current ACPR value is compared with the previous ACPR value; if the ACPR improves, Tτ is varied in the same direction, but if the ACPR worsens, Tτ is varied in the opposite direction. By repeating this process, Tτ is caused to settle to an optimum value. In addition, the supervisory control circuit 11g in FIG. 18 determines the amounts of phase and amplitude adjustments for the vector adjusting circuit 32 so as to optimize the ACPR. More specifically, after the delay time Tτ has settled, for example, the amount of attenuation or the amount of phase shift in the vector adjusting circuit 32 is increased or decreased, and the current ACPR value is compared with the previous ACPR value; if the ACPR improves, the amount of attenuation or the amount of phase shift is varied in the same direction, but if the ACPR worsens, the amount of adjustment is varied in the opposite direction. By repeating this process for the adjustment of the amount of attenuation and for the adjustment of the amount of phase shift in alternating fashion, the amount of attenuation and the amount of phase shift are each caused to settle to an optimum value.

It is desirable that the updating of the distortion compensating coefficient table 11a be also performed while the amount of attenuation or the amount of phase shift in the vector adjusting circuit 32 is being varied.

For example, when the amount of attenuation or the amount of phase shift is varied, if it is detected that the updating of the coefficient in the table 11a has settled within a prescribed range, the ACPR at the time of the detection is compared with the ACPR before the variation, to determine whether the ACPR has improved or not, and the amount of attenuation or the amount of phase shift is corrected in the direction that improves the ACPR.

The above description has dealt with an example in which the signal extraction circuit according to one embodiment of the present invention is applied for extracting the feedback signal in the distortion-compensated amplifier that uses the predistortion technique, but it will be appreciated that the present invention can also be applied to other circuits.

Figure 19:
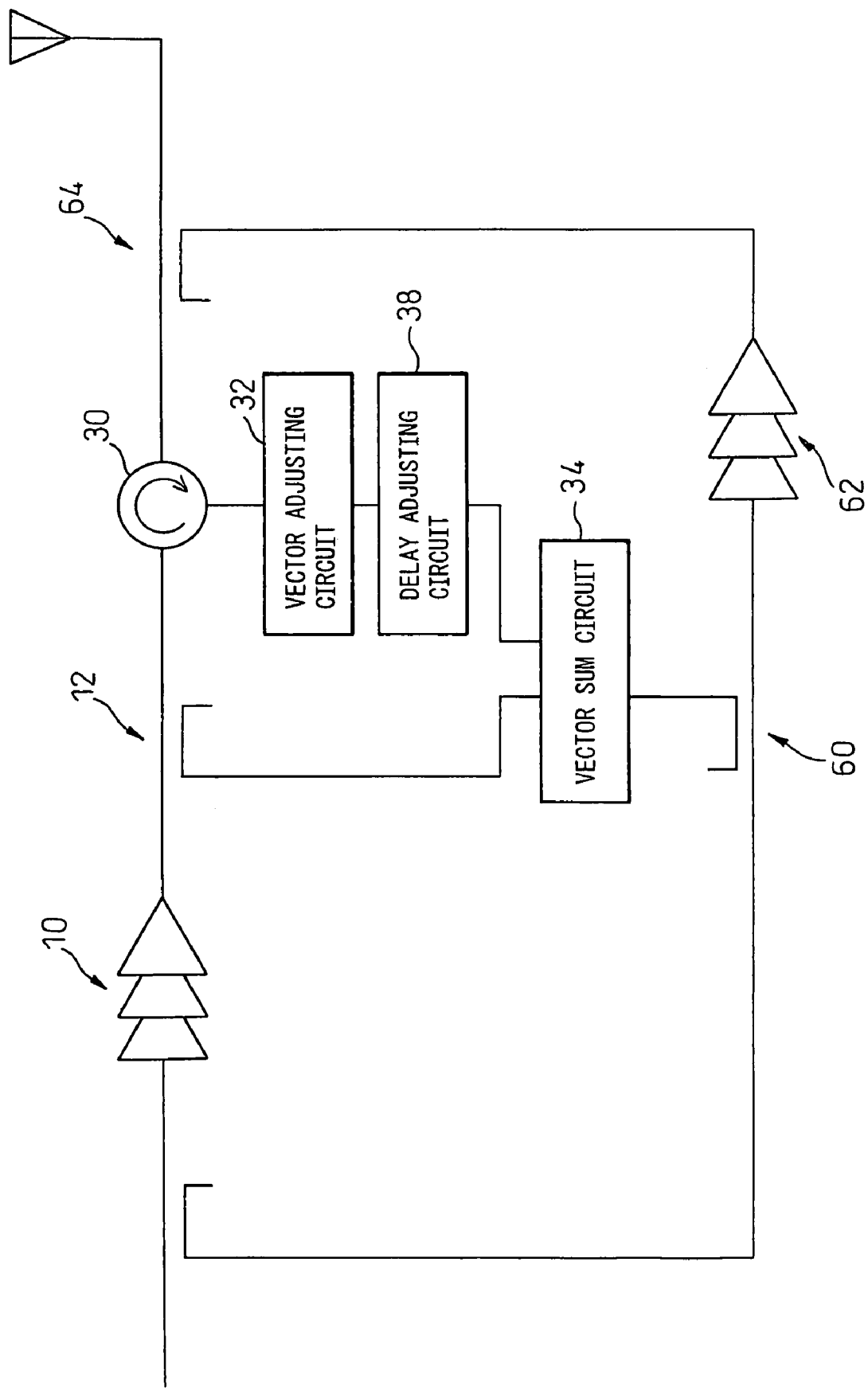
FIG. 19 is a diagram showing an example in which the signal extraction circuit according to the embodiment of the present invention is used in a feedforward amplifier.

FIG. 19 shows an example in which the present invention is applied for extracting an amplifier output signal in a feedforward amplifier. In the feedforward amplifier, the output of the amplifier 10 extracted by the directional coupler 12 is combined in a directional coupler 60 with the input of the amplifier 10 in equal amplitude and an opposite phase relationship, thereby extracting only the distortion component, and the distortion component is then amplified by an amplifier 62 and combined in a directional coupler 64 in equal amplitude and an opposite phase relationship, thus achieving distortion-free amplification. The reflected signal produced at the antenna connecting portion is extracted by the circulator 30, and the amplitude and phase are adjusted by the vector adjusting circuit 30, followed by the adjustment of the delay by the delay adjusting circuit 38; in this way, the reflected wave reflected from the antenna connecting portion and leaking into the output of the amplifier 10 extracted by the directional coupler 12 can be canceled.

Figure 20:
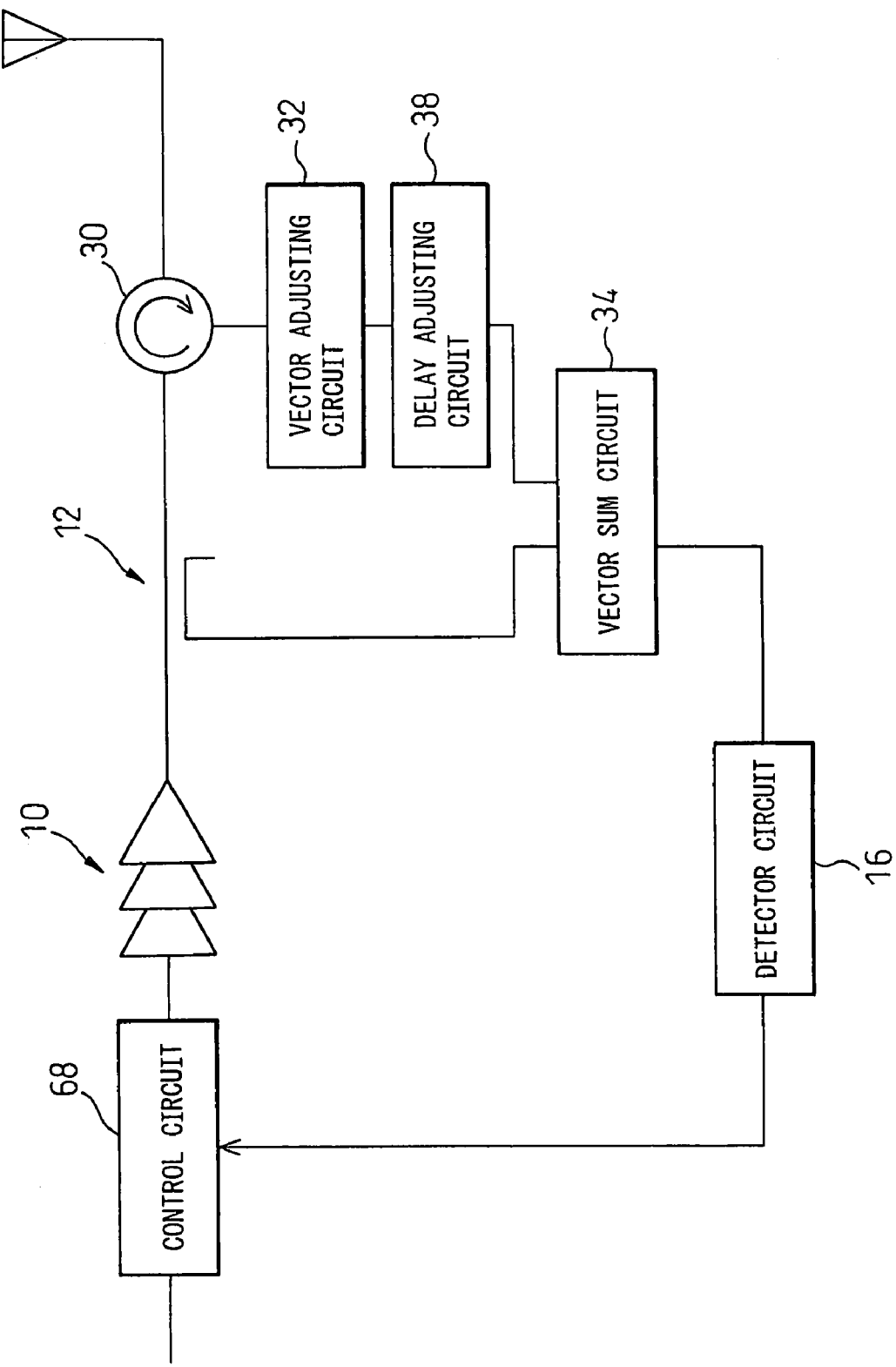
FIG. 20 is a circuit diagram showing an example in which the signal extraction circuit according to the embodiment of the present invention is used in an ALC amplifier.

FIG. 20 shows an example in which the present invention is applied for extracting an amplifier output signal in an ALC (Automatic Level Control) amplifier. In the ALC amplifier, the output of the amplifier 10 is extracted, and the extracted output is detected by a detector circuit 66 and fed back to a control circuit 68 for the amplifier 10, thereby controlling the output signal level of the amplifier 10 at a constant level. The reflected signal produced at the antenna connecting portion is extracted by the circulator 30, and the amplitude and phase are adjusted by the vector adjusting circuit 30, followed by the adjustment of the delay by the delay adjusting circuit 38; in this way, the reflected wave reflected from the antenna connecting portion and leaking into the output of the amplifier 10 extracted by the directional coupler 12 can be canceled.

Figure 21:
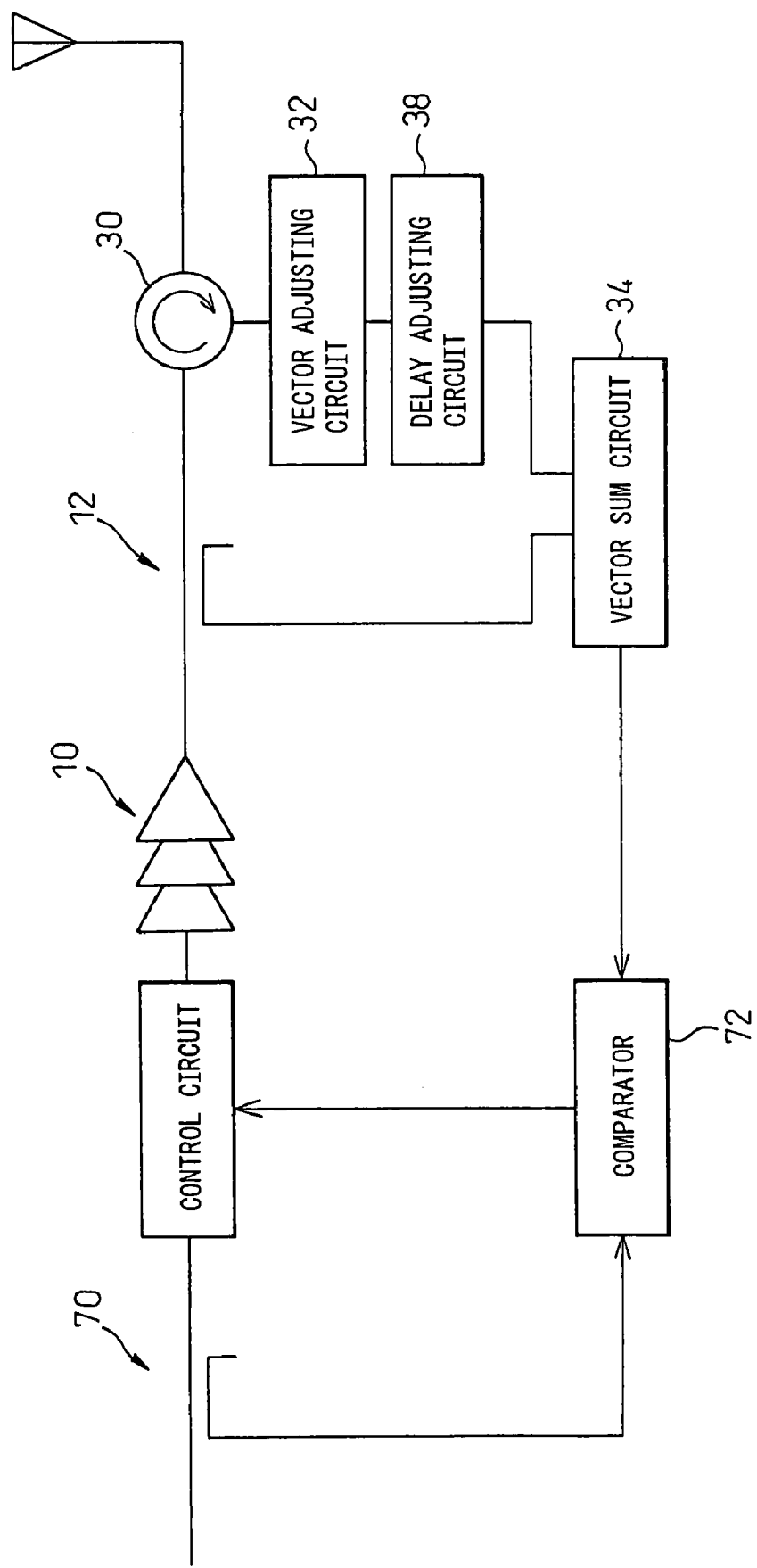
FIG. 21 is a circuit diagram showing an example in which the signal extraction circuit according to the embodiment of the present invention is used in an AGC amplifier.

FIG. 21 shows an example in which the present invention is applied for extracting an amplifier output signal in an AGC (Automatic Gain Control) amplifier. In the AGC amplifier, the input and output of the amplifier 10 are extracted by couplers 70 and 12, respectively, and compared in a comparator 72, and the result of the comparison is fed back to a control circuit 68 for the amplifier 10, thereby controlling the gain of the amplifier 10 at a constant level. The reflected signal produced at the antenna connecting portion is extracted by the circulator 30, and the amplitude and phase are adjusted by the vector adjusting circuit 30, followed by the adjustment of the delay by the delay adjusting circuit 38; in this way, the reflected wave reflected from the antenna connecting portion and leaking into the output of the amplifier 10 extracted by the directional coupler 12 can be canceled.

Figure 22:
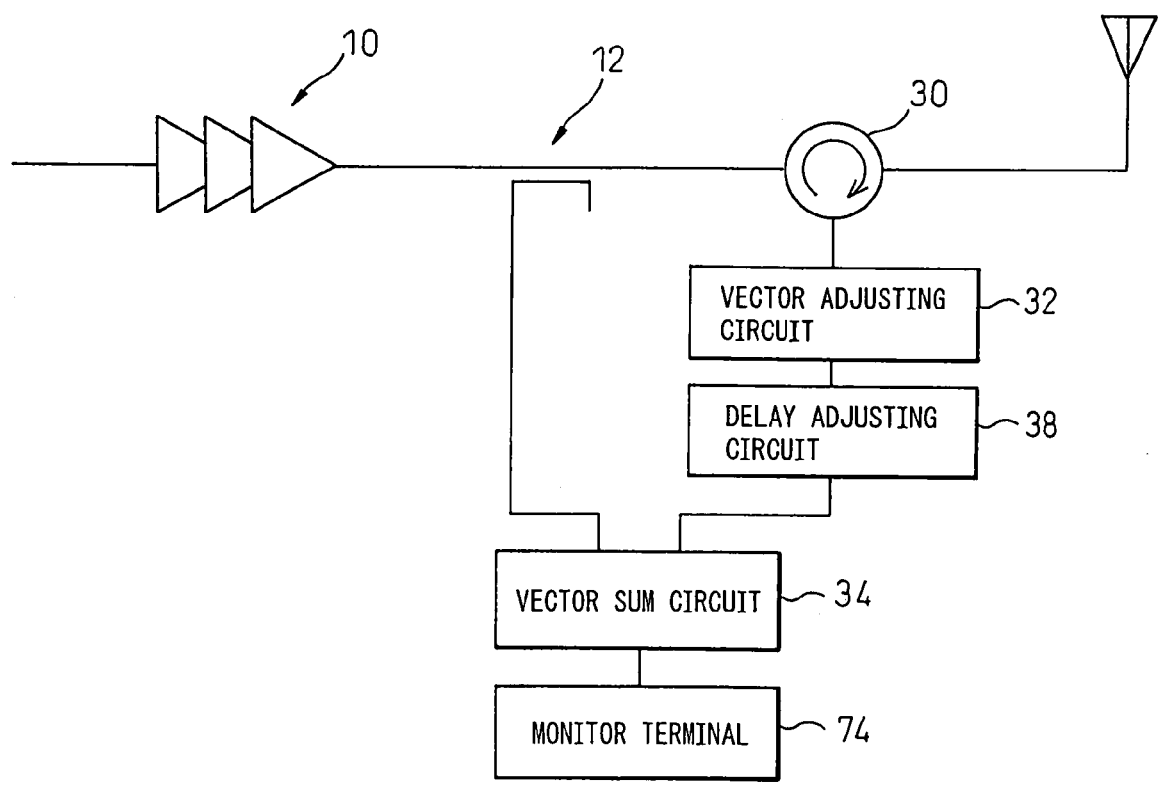
FIG. 22 is a circuit diagram showing an example in which the signal extraction circuit according to the embodiment of the present invention is used in a radio-frequency output monitor circuit.

FIG. 22 shows an example in which the present invention is applied for extracting an amplifier output signal in a monitor circuit which monitors the radio frequency output of the amplifier. In this monitor circuit, the output of the amplifier 10 is extracted and directly output at a monitor terminal. The reflected signal produced at the antenna connecting portion is extracted by the circulator 30, and the amplitude and phase are adjusted by the vector adjusting circuit 30, followed by the adjustment of the delay by the delay adjusting circuit 38; in this way, the reflected wave reflected from the antenna connecting portion and leaking into the output of the amplifier 10 extracted by the directional coupler 12 can be canceled.

Figure 23:
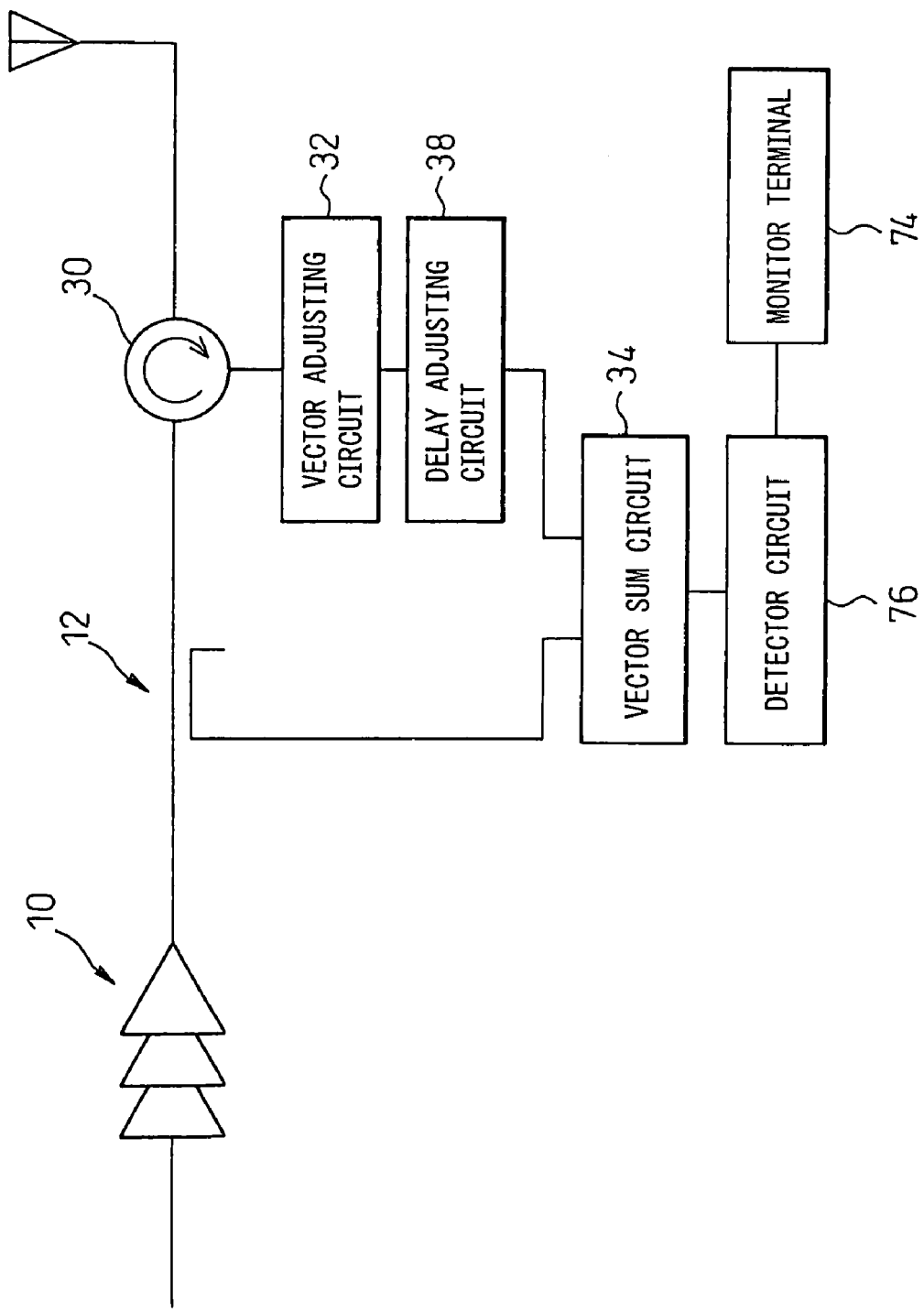
FIG. 23 is a circuit diagram showing an example in which the signal extraction circuit according to the embodiment of the present invention is used in a DC output monitor circuit.

FIG. 23 shows an example in which the present invention is applied for extracting an amplifier output signal in a monitor circuit which monitors the DC output of the amplifier. In this monitor circuit, the output of the amplifier 10 is extracted, and the extracted output is detected by a detector circuit 76 and output at a monitor terminal 74. The reflected signal produced at the antenna connecting portion is extracted by the circulator 30, and the amplitude and phase are adjusted by the vector adjusting circuit 30, followed by the adjustment of the delay by the delay adjusting circuit 38; in this way, the reflected wave reflected from the antenna connecting portion and leaking into the output of the amplifier 10 extracted by the directional coupler 12 can be canceled.

The invention claimed is:

1. A signal extraction circuit comprising:
   a distributor which is provided between a connecting portion to an antenna and an output of an amplifier, and which extracts a portion of the output of said amplifier as a feedback signal;
   an irreversible element, provided between said connecting portion and the output of said amplifier, for extracting a reflected signal produced at said connecting portion;
   a combining circuit which combines said feedback signal with said reflected signal; and
   a vector adjusting circuit which is provided at at least one of a point between said distributor and said combining circuit and a point between said irreversible element and said combining circuit, and which is capable of adjusting at least one of the phase and amplitude of the signal input thereto.

2. A signal extraction circuit according to claim 1, wherein said vector adjusting circuit is provided between said irreversible element and said combining circuit.

3. A signal extraction circuit according to claim 2, wherein said irreversible element is provided between said connecting portion and said distributor.

4. A signal extraction circuit according to claim 3, further comprising a delay adjusting circuit which is provided between said irreversible element and said combining circuit, and which adjusts delay of said extracted reflected signal.

5. A signal extraction circuit according to claim 1, wherein said irreversible element is a circulator.

6. A distortion-compensated amplifier comprising:
   an amplifier for amplifying a signal;
   a distributor, which is provided between a connecting portion to an antenna and an output of said amplifier, and which extracts a portion of the output of said amplifier as a feedback signal;
   a predistorter which, based on an input to said amplifier and on said feedback signal, corrects the input to be applied to said amplifier and thereby cancels distortion occurring in said amplifier;
   an irreversible element, provided between said connecting portion and the output of said amplifier, for extracting a reflected signal produced at said connecting portion;

a combining circuit which combines said feedback signal with said reflected signal and thereby generates the feedback signal to be supplied to said predistorter; and a vector adjusting circuit which is provided at at least one of a point between said distributor and said combining circuit and a point between said irreversible element and said combining circuit, and which is capable of adjusting at least one of the phase and amplitude of the signal input thereto.

7. A distortion-compensated amplifier according to claim 6, further comprising:

a quality evaluator which evaluates the quality of the output of said combining circuit; and an automatic adjuster which automatically adjusts the phase and amplitude in said vector adjusting circuit, based on a quality evaluation result supplied from said quality evaluator.

8. A distortion-compensated amplifier according to claim 7, wherein said quality evaluator includes a Fourier transform for calculating an adjacent channel leakage power ratio in the output of said combining circuit, and said automatic adjuster automatically adjusts said phase and amplitude so that the adjacent channel leakage power ratio calculated by said quality evaluator becomes a minimum.

9. A distortion-compensated amplifier according to claim 8, wherein the adjacent channel leakage power ratio calculated by said quality evaluator is further used for calculation of a correction coefficient in said predistorter, and after said correction coefficient has settled, said automatic adjuster starts the automatic adjustment of said phase and amplitude.

10. A signal extraction circuit according to claim 6, wherein said vector adjusting circuit is provided between said irreversible element and said combining circuit.

11. A signal extraction circuit according to claim 10, wherein said irreversible element is provided between said connecting portion and said distributor.

12. A signal extraction circuit according to claim 11, further comprising a delay adjusting circuit which is provided between said irreversible element and said combining circuit, and which adjusts delay of said extracted reflected signal.

13. A distortion-compensated amplifier according to claim 6, wherein said irreversible element is a circulator.

* * * * *